(12) United States Patent
Lee

(10) Patent No.: US 6,790,767 B2
(45) Date of Patent: Sep. 14, 2004

(54) METHOD FOR FORMATION OF COPPER DIFFUSION BARRIER FILM USING ALUMINUM

(75) Inventor: Jae Suk Lee, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/306,491

(22) Filed: Nov. 27, 2002

(65) Prior Publication Data

US 2003/0100182 A1 May 29, 2003

(30) Foreign Application Priority Data

Nov. 28, 2001 (KR) ................................ 10-2001-0074751

(51) Int. Cl.[7] .......................................... H01L 21/4763
(52) U.S. Cl. ..................... 438/627; 438/635; 438/643; 438/653; 438/658; 438/687; 438/688
(58) Field of Search ................................ 438/627, 635, 438/643, 653, 658, 687–688

(56) References Cited

U.S. PATENT DOCUMENTS

| | | | |
|---|---|---|---|
| 5,985,763 A | * | 11/1999 | Hong et al. ................. 438/688 |
| 6,271,136 B1 | | 8/2001 | Shue et al. |
| 6,362,526 B1 | | 3/2002 | Pramanick et al. |
| 6,376,355 B1 | * | 4/2002 | Yoon et al. ................. 438/643 |
| 6,391,769 B1 | * | 5/2002 | Lee et al. ................... 438/643 |
| 6,441,492 B1 | | 8/2002 | Cunningham |
| 2002/0197857 A1 | * | 12/2002 | Akram et al. ............... 438/653 |

* cited by examiner

Primary Examiner—Lynne A. Gurley
(74) Attorney, Agent, or Firm—Timothy J. Keefer; Seyfarth Shaw LLP

(57) ABSTRACT

A method for formation of a copper diffusion barrier film using aluminum is disclosed. In the method, thin aluminum (Al) film is deposited on a dielectric, and a surface of the deposited aluminum film is plasma treated with $NH_3$, thereby transforming the surface of the plasma treated aluminum film into a nitride film basically composed of aluminum nitride ($Al_xN_y$), and an aluminum film is deposited on the surface of the transformed aluminum nitride film, and copper is deposited on the surface of the deposited aluminum film. Therefore, because the diffusion of copper is suppressed, the problem that leakages between metal lines increase as pitches between the metals decrease due to high integration of parts of semiconductor can be settled.

2 Claims, 2 Drawing Sheets

METHOD FOR FORMATION OF COPPER DIFFUSION BARRIER FILM USING ALUMINUM

BACKGROUND OF THE INVENTION

1. Field of the Invention

The present invention relates to a method for formation of copper diffusion barrier film using aluminum, and more particularly to a method for formation of copper diffusion barrier film in a method for formation of copper wiring employing a chemical-mechanical polishing (CMP) process, in which a thin aluminum film is deposited on a dielectric, the aluminum film is transformed into a nitride film basically composed of aluminum nitride (hereinafter, AlxNy), an aluminum film is deposited again on the transformed nitride film, and copper is deposited on the deposited aluminum film.

2. Description of the Prior Art

As generally known in the art, in a method for formation of metal wiring employing a CMP process, copper, which is one of wiring materials used for wiring semiconductor devices, is utilized as a metalization material which can reduce resistance-capacitance (RC) delay as its electric conductivity is low.

FIG. 1a and FIG. 1b are views showing a process for formation of copper diffusion barrier film in accordance with the prior art, wherein copper is deposited through electroplating, and then, is subjected to a conventional CMP process, which is not shown.

Copper is deposited through a Damascene process developed by IBM Inc., and is subjected to a CMP process. That is, a dielectric S1 pattern is formed on a substrate, then a copper diffusion barrier film S2 composed of titanium (Ti), titanium nitride (TiN), tantalum (Ta), and tantalum nitride (TaN), etc., is formed on the dielectric pattern, copper S3 is deposited on the copper diffusion barrier film through electroplating, and the copper is then subjected to the CMP process.

However, because of the high diffusion coefficient of copper in almost all (of the materials used in semiconductor fabrication, resulting in the deterioration of their transistor (TR) property, several kinds of diffusion barrier films have been developed and used in order to suppress the diffusion of copper.

Further, one more significant problem is that leakages between metal lines increase as pitches between the metals decrease, due to the high integration of semiconductor devices.

SUMMARY OF THE INVENTION

Accordingly, the present invention has been made to solve the above-mentioned problems occurring in the prior art, and an object of the present invention is to provide a method for formation of copper diffusion barrier film using aluminum, in which a first aluminum film is deposited on a dielectric, a surface of the first aluminum film is transformed to a nitride film basically composed of aluminum nitride (AlxNy) by plasma treating the surface of the first deposited aluminum film with $NH_3$ or $N_2$, then a second aluminum film is deposited again on the transformed aluminum nitride film, and copper is deposited on the second deposited aluminum film.

In order to accomplish this object, there is provided a method for formation of copper diffusion barrier film using aluminum, the method comprising: a first step of depositing a first aluminum film on a dielectric; a second step of plasma treating the surface of the first deposited aluminum with $NH_3$ or $N_2$, thereby transforming the plasma treated surface of the first aluminum film into a nitride film basically composed of aluminum nitride (AlxNy); a third step of depositing a second aluminum film on the transformed nitride film; and a fourth step of depositing a copper on the second aluminum film deposited.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIG. 2a to FIG. 2d show a method for formation of copper diffusion barrier film using aluminum in accordance with the present invention. The method of the present invention comprises steps of: depositing a first aluminum film (Al) S4 on a dielectric S1, plasma treating a surface of the deposited aluminum film S4 with $NH_3$, thereby transforming the plasma treated surface of the first aluminum film S4 into a nitride film basically composed of aluminum nitride (AlxNy) S5, depositing a second aluminum film (Al) S6 on the transformed nitride film, and depositing copper (Cu) S7 on the second deposited aluminum film S6.

Based on the above-mentioned process, the method for formation of copper diffusion barrier film using aluminum according to the present invention will be described in more detail hereinafter.

Figure 1A:
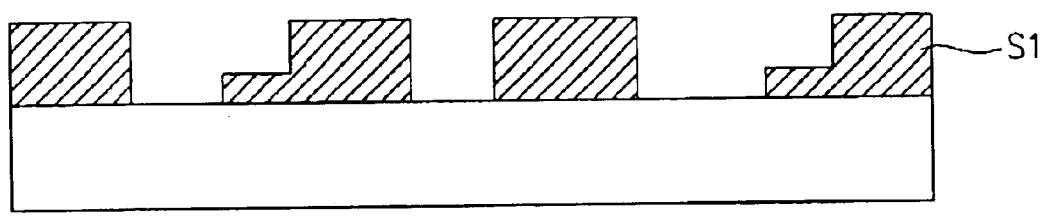
FIGS. 1a and 1b are views showing a process for formation of copper diffusion barrier film in accordance with the prior art, wherein copper is deposited through electroplating, and then, is subjected to a conventional CMP process, which is not shown.
Figure 1B:
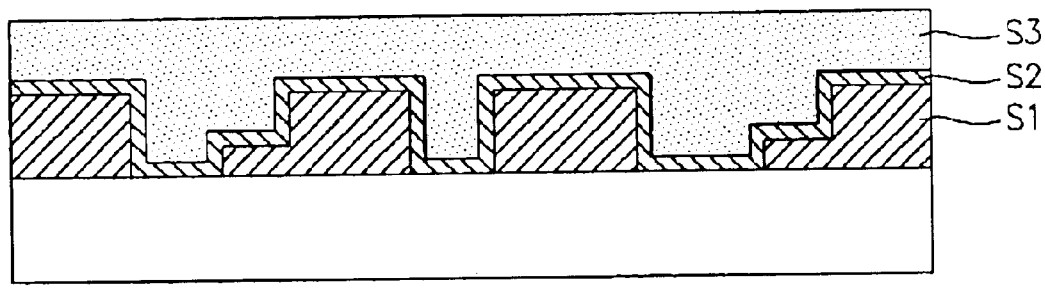
Figure 2A:
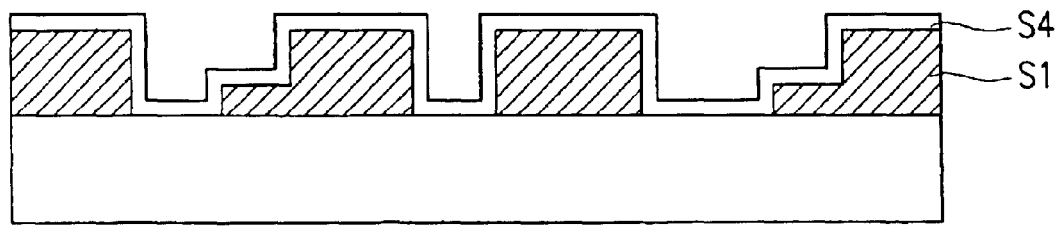
FIGS. 2a to 2d are views showing a process for formation of copper diffusion barrier film using aluminum in accordance with the present invention, wherein a conventional CMP process can be performed after the deposition of copper, which is not shown.

As shown in FIG. 2a, a thin aluminum (Al) film S4 is firstly deposited on a dielectric S1. At this step, the aluminum film S4 is deposited through a sputtering method or a chemical vapor deposition method (CVD) and has a thickness of at most 100Å.

Figure 2B:
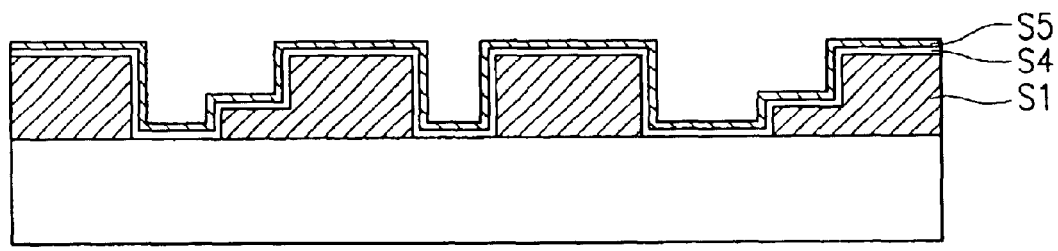

Then, as shown in FIG. 2b, a plasma treatment is performed with $NH_3$ or $N_2$ on a surface of the first deposited aluminum film S4, so that the plasma treated surface of the first aluminum film is transformed into a nitride film basically composed of aluminum nitride (AlxNy) S5.

Figure 2C:
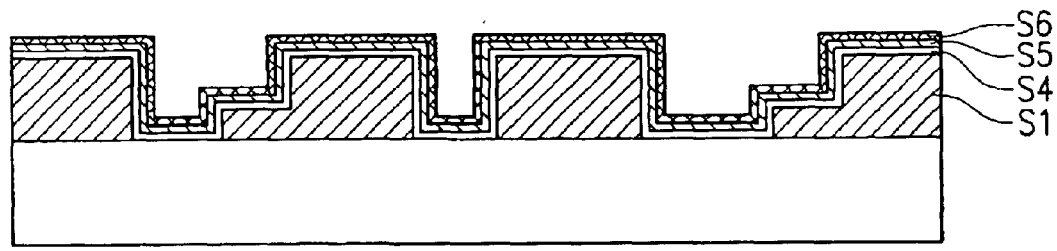

Subsequently, as shown in FIG. 2c, a second aluminum (Al) film S6 is again deposited on the transformed nitride film S5. At this step, the second aluminum film S6 is deposited through a sputtering method or a chemical vapor deposition method (CVD) and has a thickness of at most 100Å.

Figure 2D:
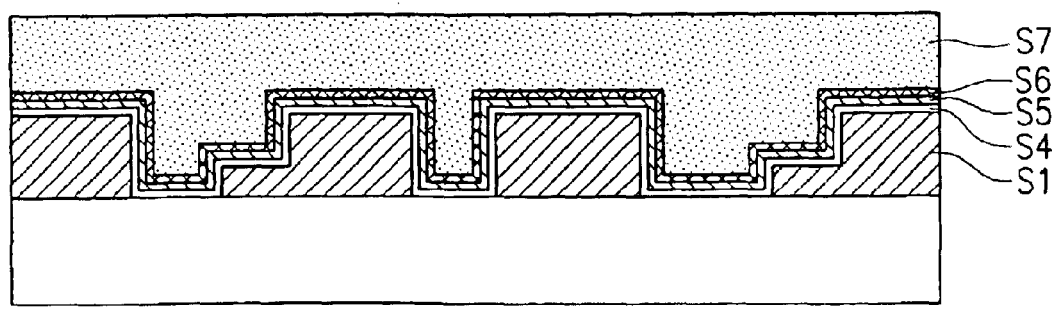

Finally, as shown in FIG. 2d, copper (Cu) S7 is deposited on the second deposited aluminum film S6 in order to form a copper diffusion barrier film.

Therefore, as described above, the method according to the present invention comprises the steps of: depositing a first thin aluminum film on a dielectric, transforming the surface of the first deposited aluminum film into a nitride film basically composed of aluminum nitride (AlxNy) by plasma treatment with $NH_3$ or $N_2$, depositing a second aluminum film on the transformed aluminum nitride film, and depositing a copper on the second deposited aluminum film. Therefore, the method according to the present invention can suppress the diffusion of copper and prevent leakages due to the copper diffusion between metal lines from increasing according to the decrease of pitches between the metals as semiconductor devices are more highly integrated.

Although a preferred embodiment of the present invention has been described for illustrative purposes, those skilled in the art will appreciate that various modifications, additions and substitutions are possible, without departing from the scope and spirit of the invention as defined by the accompanying claims.

What is claimed is:

1. A method for formation of copper diffusion barrier film using aluminum, the method comprising:

a first step of depositing a first aluminum film on a dielectric;

a second step of plasma treating a surface of the first aluminum film with $NH_3$ or $N_2$, thereby transforming the plasma treated surface of the first aluminum film into a nitride film basically composed of aluminum nitride (AlxNy);

a third step of depositing a second aluminum film on the transformed nitride film; and a fourth step of depositing copper on the second aluminum film, wherein the first aluminum film, the aluminum nitride (AlxNy) and the second aluminum film form said copper diffusion barrier film has been inserted after "aluminum film", before ".".

2. A method for formation of copper diffusion barrier film using aluminum as claimed in claim 1, wherein the first and second aluminum films are deposited through a sputtering method or a chemical vapor deposition method (CVD) and have a thickness of at most 100 Å, respectively.

* * * * *